United States Patent [19]

Nagano et al.

[11] 4,394,763
[45] Jul. 19, 1983

[54] ERROR-CORRECTING SYSTEM

[75] Inventors: Genzo Nagano; Masao Takahashi, both of Yokohama, Japan

[73] Assignee: Fujitsu Limited, Tokyo, Japan

[21] Appl. No.: 261,181

[22] PCT Filed: Aug. 29, 1980

[86] PCT No.: PCT/JP80/00199
§ 371 Date: May 1, 1981
§ 102(e) Date: Apr. 24, 1981

[87] PCT Pub. No.: WO81/00641
PCT Pub. Date: Mar. 5, 1981

[30] Foreign Application Priority Data

Aug. 31, 1979 [JP] Japan .................. 54-111152

[51] Int. Cl.³ ............... G06F 11/10; G11C 29/00
[52] U.S. Cl. ............................. 371/38; 364/900; 371/10; 371/13
[58] Field of Search ............ 371/38, 13, 10; 364/200, 900

[56] References Cited

U.S. PATENT DOCUMENTS

| | | | |
|---|---|---|---|
| 3,917,933 | 11/1975 | Scheuneman et al. | 371/10 |
| 3,949,208 | 4/1976 | Carter | 371/38 |
| 4,175,692 | 11/1979 | Watanabe | 371/38 |
| 4,255,808 | 3/1981 | Schaber | 371/38 |
| 4,296,494 | 10/1981 | Ishikawa et al. | 371/13 |
| 4,319,356 | 3/1982 | Kocol et al. | 371/38 |
| 4,359,771 | 11/1982 | Johnson et al. | 371/13 |

FOREIGN PATENT DOCUMENTS

51-137335 11/1976 Japan .

Primary Examiner—Charles E. Atkinson
Attorney, Agent, or Firm—Staas & Halsey

[57] ABSTRACT

An error-correcting system is disclosed, which is located between a main memory and a central processing unit. The system includes a relief bit memory, an ECC or Error Correction Code logic circuit, a switching circuit and a correction controlling circuit. The ECC logic circuit detects the occurrence of a soft error and a hard error. When a hard error occurs in the memory, the defective memory cell thereof is switched to the relief bit memory. Accordingly, data to be written into the main memory or the relief bit memory is switched by means of the switching circuit. Similarly, data to be read from the main memory or the relief bit memory is also switched by the switching circuit. The data to be stored in the relief bit memory is validated by means of the ECC logic circuit and the switching circuit. Further, the (n+1)-bit soft and hard errors are reduced to n-bit soft and hard errors by means of the ECC logic circuit and the switching circuit.

11 Claims, 9 Drawing Figures

ERROR-CORRECTING SYSTEM

DESCRIPTION

The present invention relates to an error-correcting system and, more particularly, relates to an error-correcting system for correcting errors occurring in a main memory of a computer system.

In recent years, most memories are fabricated by using semiconductor memory devices, so that memories having very large capacities can easily be obtained and, also, very low price memories can be realized. Generally, the larger the capacities of individual memories become, the more errors occur and accordingly, in such very large capacity memories, it is very important to supervise the occurrence of errors produced in the memories. In order to supervise the occurrence of errors, an ECC circuit or Error Correction Code logic circuit has been proposed. The ECC logic circuit usually cooperates with the main memory of the computer system, so as to automatically correct n(n is positive integer)-bit errors occurring in the memory and, also, to detect an occurrence of n+1-bit errors in the memory.

At the present time, extremely large capacity memories are about to be put to practical use. For example, in a RAM (Random Access Memory), the bit density thereof is being advanced from 64 K(Kilo)bits to 256 Kbits. Accordingly, the 256 Kbits RAM will soon be widely put to practical use.

However, when the bit density increases to such a very high bit density as, for example 256 Kbits, a certain problem arises. The problem is the occurrence of a so-called soft error. The term "soft error" is a recent term, because the phenomenon of soft errors was discovered only a few years ago. The reason such a soft error phenomenon is created is now considered and understood to be as follows. When the bit density of the memory is increased, the memory must be fabricated by using very fine conductors distributed on great number of memory cells. Accordingly, electric charges, stored in parasitic capacitors distributed along said very fine conductors, become very small. Such very small electric charges are liable to be dissipated by external forces due to, for example, an application of radio active rays, above all alpha rays, to the high density memory cells. That is, if alpha rays pass through one of the memory cells, the logic of the data (electric charges) stored in the memory cell, through which the alpha rays have passed, may easily be inverted into the opposite data logic. Thus, the above mentioned soft errors often occur in a high density memory device. It should be noted that a soft error is a single-bit error which occurs at random in the memory device and, also, does not occur repeatedly at the same memory cell.

Although the term "soft error" is the recent term, the term "hard error" is already widely known. A hard error is created due to an occurrence of trouble, breakage or wearing out of the memory device. Such hard error occurs repeatedly in the same memory cell and, also, the logic of the data stored in the memory cell having the hard error is fixed to be either the logic "1" or logic "0". We know, through experience, that the hard error may occur with a probability of 200 through 250 FIT, which means that any hard error occurs with a probability of $$\frac{200 \text{ through } 250}{10^9}$$

per hour. It is a well known fact that, usually, some of the hard errors, for example, about 30% of the hard errors among all the errors occurring during a unit of time, are hard errors that are spread over bits of a plurality of word addresses in one memory device or over a bit of all the word addresses contained in one memory device.

Further, it is important to know that, in the memory device having an extremely high bit density, for example 256 Kbits, the frequency of occurrence of the soft errors may be much higher than the frequency of occurrence of the hard errors, by more than one thousand times. Consequently, the following problems will be produced.

(A) Firstly, although certain fixed data have been written in respective memory cells through write operations, soft errors may occur at two bit positions within each of some words as time elapses after said write operation. That is, soft errors at two bit positions within a single word can occur. However, in this case, the above mentioned ECC logic circuit cannot correct such 2-bit errors in one word. This is because, as previously mentioned, the ECC logic circuit functions so as to correct n-bit errors and also detect an occurrence of (n+1)-bit errors. Generally, the positive number n is determined to be 1, that is n=1, from the point of view of the use of hardware in the computer system, and accordingly, the ECC logic circuit usually cannot correct the above mentioned 2-bit soft errors, that occur in one word but merely detect the occurrence thereof.

(B) Second, when the hard errors occur and are spread over bits of a plurality of word addresses, it can be concluded that each of the very large number of words contains 1-bit error therein at the same time. Taking as an example a RAM device having 64 Kbits, there is a possibility that a 1-bit errors occurs in each of the 64,000 words at most. In this case, if each of the words comprises 8 bytes, such 1-bit error is spread all over the words of the memory device having a capacity of 0.5 M(Mega)bytes. If this occurs in the memory device, since as previously mentioned, the frequency of occurrence of the soft errors is very high, the 2-bit errors will frequently be created in some bits within one word of the 0.5 Mbytes, after about ten hours from the time of said write operation. It should be noted that such 2-bit errors in one word cannot be corrected by means of the ECC logic circuit.

Regarding the above mentioned 2-bit errors, the 2-bit errors may be classified into wo modes or types. In a first mode or type, the 2-bit errors comprise both a first 1-bit soft error and a second 1-bit soft error both in different words. In a second mode or type, the 2-bit errors comprise both a 1-bit hard error and a 1-bit soft error. With regard to the first mode, it is easy for the ECC logic circuit to correct such 2-bit soft errors that occur in different words. This is because, as previously mentioned, the soft error does not occur repeatedly in the same memory cell. Accordingly, if the ECC logic circuit detects each soft error in one of the words and corrects the same, thereafter, the data at the corresponding memory cell can be corrected by writing the corrected data again into the same memory cell. Alternately, such soft error can also be corrected by the ECC logic circuit. That is when the ECC logic circuit detects such soft error in one of the words during an ordinary memory accessing operation, the ECC logic circuit can correct the same by rewriting the corrected data again into the same memory cell. Further, it may also be possible for the ECC logic circuit to, first scan with a certain period the memory device and read the data of all the addresses thereof sequentially, and then, if the soft error in one of the words is found, rewrite the corrected data again into the same memory cell.

However, in the above mentioned second mode, including both a 1-bit hard error and a 1-bit soft error, each in different words it is impossible for the ECC logic circuit to totally correct the errors by the same rewriting operation as explained above with regard to the first mode, which includes only soft errors. Therefore, if such errors of the second mode occur in the memory device, such errors are left as they are until the next periodical maintenance is carried out. The effect of leaving such errors alone is not serious for a computer system having a relatively small capacity main memory. However, the effect of leaving such errors alone is very bad for a computer system having a very large capacity main memory, such as a main memory having more than 8 through 10 Mbytes. This is because, in such a very large capacity main memory, the above mentioned 2-bit errors of the second mode may occur very frequently. Thus, such 2-bit errors must not be disregarded, so that an increase in reliability can be maintained in the large capacity computer system.

SUMMARY OF THE INVENTION

An object of the present invention is, therefore, to provide an error-correcting system which can correct the aforesaid 2-bit errors of the second mode, including both hard and soft errors. Further, it is also an object of the present invention to create an error-correcting system which can be made of very simple hardware.

According to the present invention, there is provided an error-correcting system comprising a first means for discriminating whether an error is a soft error or a hard error, a second means for storing data and taking the place of a memory cell having a hard error, a third means for, when a hard error is found, switching the data in the corresponding memory cell to said second means, a fourth means for effecting a validation operation with respect to data stored in said second means. Preferably, the error-correcting system further includes a fifth means for, when n+1-bit errors are found during the validation operation, reducing the n+1-bit errors to n-bit errors by inverting the logic of the output data from said second means, and further, carrying out a rewriting operation, into the second means, inputting corrected data which is corrected by means of the ECC logic circuit.

DETAILED DESCRIPTION OF THE PREFERRED EMBODIMENTS

The present invention will become more apparent from a detailed description of preferred embodiments presented below, with reference to the accompanying drawings.

Figure 1:
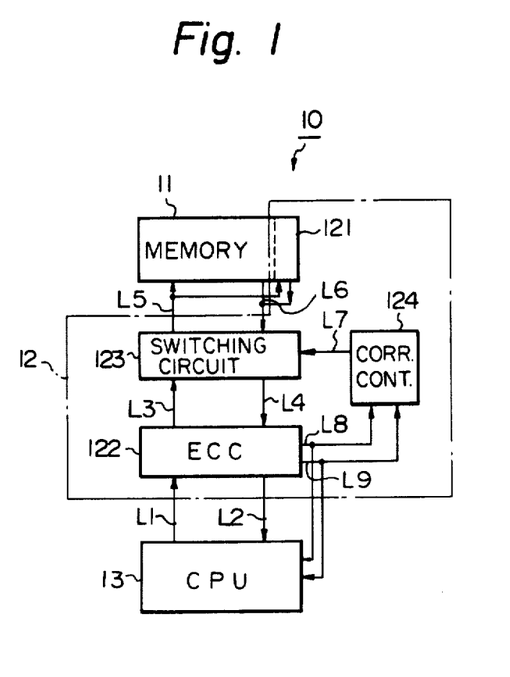
FIG. 1 is a block diagram of a computer system in which an error-correcting system according to the present invention is employed.

Referring to FIG. 1, a computer system 10 comprises a memory, such as a main memory 11, an error-correcting system 12 and a CPU (Central Processing Unit) 13. The error-correcting system 12 functions as a 2-bit error-correcting system. The error correcting system 12 cooperates with the CPU 13, mainly via signal lines L1 and L2, and also via signal lines L8 and L9. The line L1 transfers write data to the memory 11, while, the line L2 transfers read data from the memory 11. The 2-bit error-correcting system 12 comprises a relief bit memory 121, an ECC logic circuit 122, a switching circuit 123 and a correction controlling circuit 124. The relief bit memory 121 is incorporated within the main memory 11. The ECC logic circuit 122 operates to correct the 1-bit error and also to detect the occurrence of the 2-bit errors. The ECC logic circuit 122 transfers the write data, from the CPU 13, together with the error-correction code, to the main memory 11 or the relief bit memory 121, via signal line L3, the switching circuit 123 and signal line L5. On the other hand, the ECC logic circuit 122 receives the read data, together with the error-correction code, from the main memory 11 or the relief bit memory 121, via signal line L6, the switching circuit 123 and signal line L4, and then, removes the error-correction code from the read data, so as to transfer only the read data, via the signal line L2, to the CPU 13. At the same time, the ECC logic circuit 122 produces a 1-bit or 2-bit error-detection signal, and also, when an occurrence of a 1-bit error is detected, the ECC logic circuit 122 produces an error-position signal. The error-position signal indicates an address at which the hard error has occurred in the main memory 11. The error-detection signal is transferred from the ECC logic circuit 122 to both the correction controlling circuit 124 and the CPU 13, via signal line L9. On the other hand, the error-position signal is transferred from the ECC logic circuit 122 to both the correction controlling circuit 124 and the CPU 13, via signal line L8. Then the correction controlling circuit 124 supplies a relief bit selection signal and a control signal (mentioned hereinafter) to the switching circuit 123, via signal line L7. In this figure, it should be understood that typical and conventional address input signal lines, write control signal lines and read control signal lines are not illustrated, however, these lines are directly connected between the CPU 13 and the memories 11 and 121.

Figure 2A:
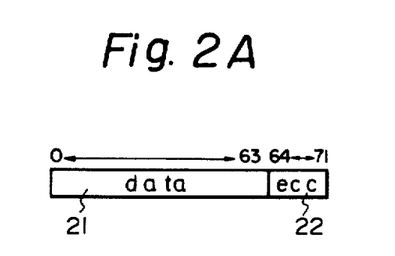
FIG. 2A illustrates an arrangement of a memory array of a conventional memory, having no relief memory.
Figure 2B:
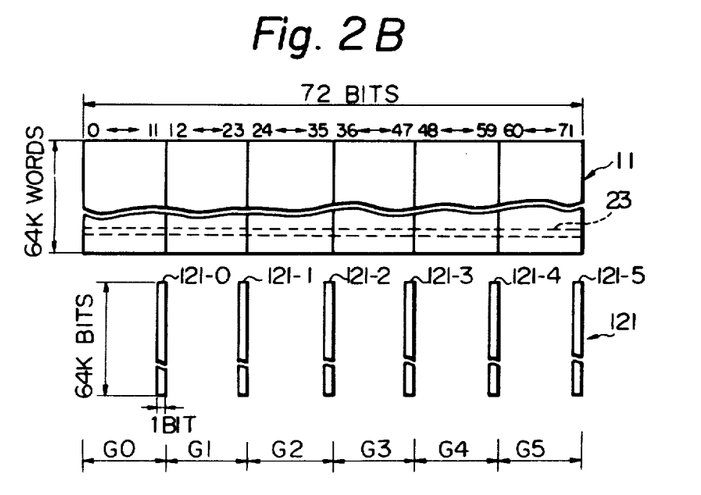
FIG. 2B illustrates an arrangement of memory arrays of a memory, having a relief memory, according to the present invention.

The arrangement of the memory arrays for both the main memory 11 and the relief bit memory 121, according to the present invention, will be clarified with reference to FIG. 2B, by comparing them with the arrangement of the memory array of a conventional memory, having no relief bit memory, illustrated in FIG. 2A. In FIG. 2A, data 21 comprises, for example a 0th through 63rd bits of data, because each word comprises 8 bytes, and an error-correction code (ecc) 22 from the 64th through 71st bits is added to the data 21. Thus, each completed word is composed of 72 (64+8) bits.

In FIG. 2B, the main memory 11 (see FIG. 1) comprises for example, 0.5 Mbytes of memory. The 0.5 Mbytes memory comprises 64K words, each of which 64K words comprises 72 bits. Accordingly, a specified one of the words, for example, word 23, illustrated by a dotted line, is a unit of data which is processed during each operation performed in the ECC logic circuit 12 (see FIG. 1).

The relief bit memory 121 (see FIG. 1) of the present invention, comprises of one or more relief bit main memories. In this example, the 0 through 71st bits of the memory 11 are classified into six groups, such as G0 (0 through 11th bits), G1 (12th through 23rd bits), G2 (24th through 35th bits), G3 (36th through 47th bits), G4 (48th through 59th bits) and G5 (60th through 71th bits). Accordingly, six relief bit memories 121-0 through 121-5 are allotted to respective groups G0 through G5. Each of the relief bit memories (121-0 through 121-5) is constructed so as to have a width of 1 bit (see "1 BIT" in FIG. 2B) and a length of 64 Kbits (see "64KBITS" in FIG. 2B). Consequently, since the main memory 11 has addresses corresponding to 64K words, each of the relief bit memories 121-0 through 121-5 can relieve one bit in each of the 64K words, contained in each of the corresponding groups G0 through G5. Thus, each of the relief bit memories 121-0 through 121-5 functions to relieve the hard error bits of main memory 11, created in each of the corresponding groups G0 through G5.

Figure 3:
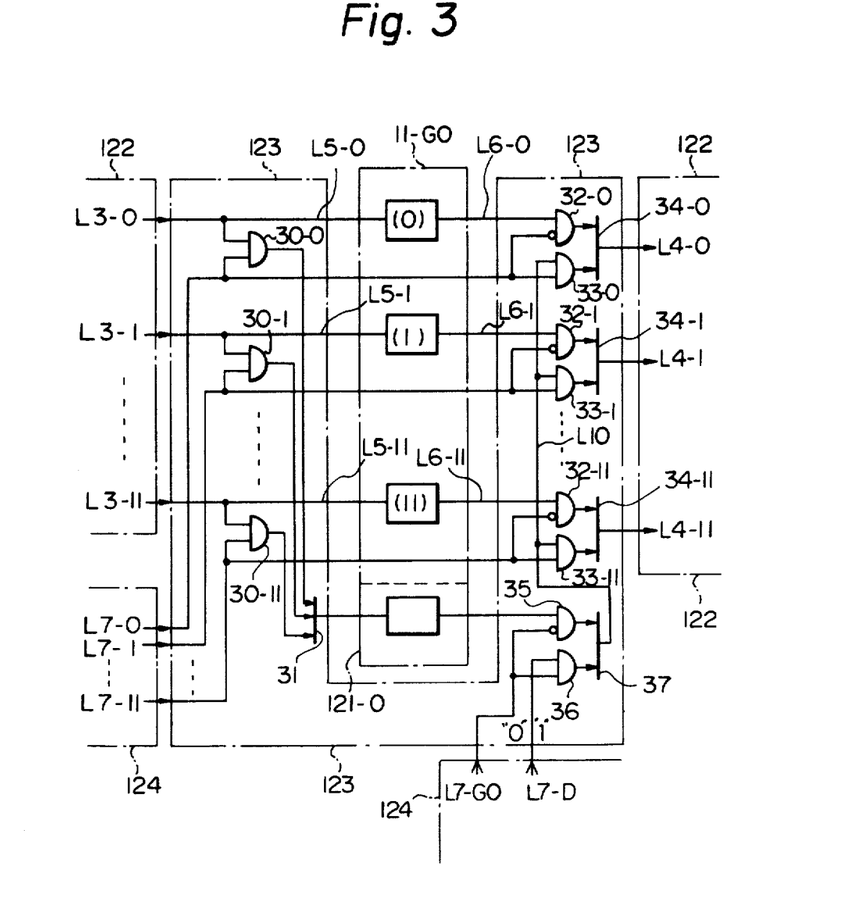
FIG. 3 illustrates details of one example of the error-correcting system 12, illustrated in FIG. 1, according to the present invention.

Details of the error-correcting system 12 illustrated in FIG. 1, are illustrated in FIG. 3. In FIG. 3, regions 122, 123 and 124, indicated by long-dash lines, are respectively identical to the ECC logic circuit 122, the switching circuit 123 and the correction controlling circuit 124, illustrated in FIG. 1. Further, signal lines (L3-0, L3-1 through L3-11), (L4-0, L4-1 through L4-11), (L5-0, L5-1 through L5-11), (L6-0, L6-1 through L6-11) and (L7-G0, L7-D) are respectively distributed along the signal lines L3, L4, L5, L6 and L7, illustrated in FIG. 1. It should be understood that the arrangement of FIG. 3 is illustrated with regard to one of the relief bit memories 121-0 through 151-5 (see FIG. 2B), for example, the memory 121-0, which is allotted to the group G0 (see FIG. 2B). Therefore, if the error-correcting system 12 (see FIG. 1) includes k (k is positive integer) relief bit memories, k arrangements, having an identical arrangement to that of FIG. 3, must be employed in the error-correcting system 12. In FIG. 3, memory 11-G0 of the group G0 contains therein eleven memory bits (0), (1) through (11), which correspond to the 0th through 11th bits shown in FIG. 2B. The mmeory 11-G0 of the group G0 cooperates with the relief bit memory 121-0. The write data, transferred from the ECC logic circuit 122 on the signal lines L3-0, L3-1 through L3-11, pass through the switching circuit 123 and are supplied to the memory 11-G0, via the signal lines L5-0, L5-1 through L5-11. When one of AND gates 30-0, 30-1 through 30-11 is opened by one of the relief bit selection signals, transferred on the signal lines L7-0, L7-1 through L7-11, one of the bits of said write data is supplied to the relief bit memory 121-0 via the AND gate, which is opened by the relief bit selection signal, and via an OR gate 31. The relief bit selection signal, transferred on the line L7-0, L7-1 through L7-11, is originally product by the ECC logic circuit 122, as the error position signal and turned into the relief bit selection signal. The relief bit selection signal is used to switch the mmeory bit ((0), (1) through (11)) to the relief bit memory 121-0, when the ECC logic circuit circuit 122 has detected a bit error during a read operation of the read data, transferred on the lines L4-0, L4-1 through L4-11. If the bit error occurs in the memory bit (1), the relief bit selection signal of logic "1" is supplied via the line L7-1. On the other hand, during a read operation, the read data are supplied to the CPU (see 13 in FIG. 1), via OR gates 34-0, 34-1 through 34-11, the signal lines L4-0, L4-1 through L4-11 and the ECC logic circuit 122. In this case, each of the OR gates 34-0, 34-1 through 34-11 possess either data from the corresponding memory bits ((0), (1) through (11)) or data from the relief bit memory 121-0, via OR gate 37. If, for example the memory bit (1) contains an error bit, the relief bit selection signal of logic "1" is supplied via the line L7-1, and accordingly, AND gate 32-1 is not opened, but AND gate 33-1 is opened. Therefore, the data bit from relief bit memory 121-0 is selected and supplied, via the OR gate 37, to the OR gate 34-1. Thus, the data from the main memory bit (1), containing a bit error, is prevented from being transmitted through the OR gate 34-1. Since the relief bit selection signal (error-position signal) of logic "1" is supplied only to the line L7-1, the AND gates 32-0 through 32-11, other than 32-1, are opened. Accordingly, the data, other than the data from memory bit (1), are supplied from the memory 11-G0.

Regarding the relief bit memory 121-0, it is necessary for the memory 121-0 to store therein correct data. That is, the correct data must be the same as the data which would have been stored in one of the memory bits ((0), (1) through (11)), if no hard error had occurred at the particular memory bit. Accordingly, the validation operation must be carried out after the switching operation, from the main memory bit ((0), (1) through (11)) to the relief bit memory, 121-0 is completed, in order to store the corrected data in the relief bit memory. The validation operation can be achieved automatically by means of the ECC logic circuit 122. When the bit error occurs in, for example, the memory bit (1), the memory bit (1) is switched to the relief bit memory 121-0. Then, the data, comprising data from main memory bits (0) through (11), except for bit (1), and the relief bit memory 121-0, are produced from the OR gates 34-0, 34-1 through 34-11. The above mentioned group data and also the corresponding data from groups G1 through G5, in order to form a completed word (see 23 in FIG. 2B), are supplied to the ECC logic circuit 122. In this case, the logic of the data of memory 121-0 is not known. However, the ECC logic circuit 122 can determine whether or not the data of the memory 121-0 is correct by utilizing the error correction code. Further, the ECC logic circuit 122 can correct the data from the memory 121-0, if the initially stored data of the memory 121-0 is not correct, by utilizing said error correction code. Thereafter, the corrected data is rewritten into the memory 121-0, and the validation operation is completed.

As previously mentioned, since the frequency of occurrence of the soft errors is much higher than that of the hard errors, 2-bit errors will often occur during the validation operation. If such case, mentioned above, occurs, the validation operation can not be completed because the ECC logic circuit cannot correct 2-bit erors, but merely detect the occurrence thereof. However, according to the present invention, the error-correcting system 12 can complete, even though such 2-bit errors occur, said validation operation. The reason for this is as follows. When 2-bit errors occur during the validation operation, it is very probable that one of said 2-bit errors is an error which is produced by the relief bit memory. Therefore, if the output data from the relief bit memory is forced to be logic "1" or "0" sequentially, with the aid of the CPU 13 (FIG. 1) or a conventional service processor (not shown), it is very probable that said 2-bit errors are reduced to a 1-bit error, through the 1-bit correction operation by the ECC logic circuit 122. With reference to FIG. 3, when 2-bit errors occur during the validation operation, the correction controlling circuit 124 is given the error position signal from the ECC logic circuit 122. If the error position signal indicates the main memory bit (1) of the memory 11-G0, a gate control signal of logic "1" is supplied through signal line L7-G0. Therefore, AND gate 35 is closed and, simultaneously, AND gate 36 is opened. Next, the output data from the OR gate 37 is forced to be logic "1" or "0", by a signal supplied from the signal line L7-D. As previously mentioned, during the validation operation, since one of said 2-bit errors is very liable to be induced by the output data from the OR gate 37, the ECC logic circuit 122 can reduce the 2-bit errors to the 1-bit error by suitably providing either logic "1" or "0" from the OR gate 37. Thereafter, corrected data can be rewritten in the memory bits (0) through (11), other than (1), and also in the relief bit memory 121-0.

Regarding the arrangement of the gates 35, 36 and 37, another arrangement can also be employed, as will be explained hereinafter with reference to FIG. 5.

Figure 4A:
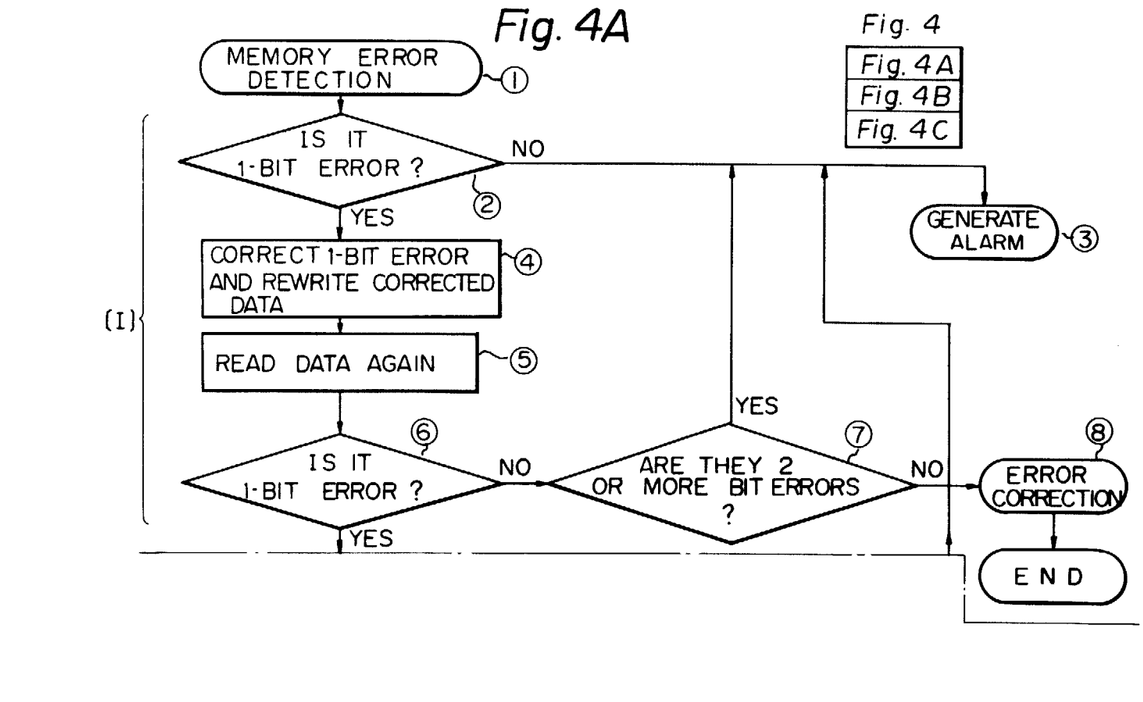
FIGS. 4A, 4B and 4C together, illustrate a flow chart used for explaining the operation of the error-correction system 12, according to the present invention.
Figure 4B:
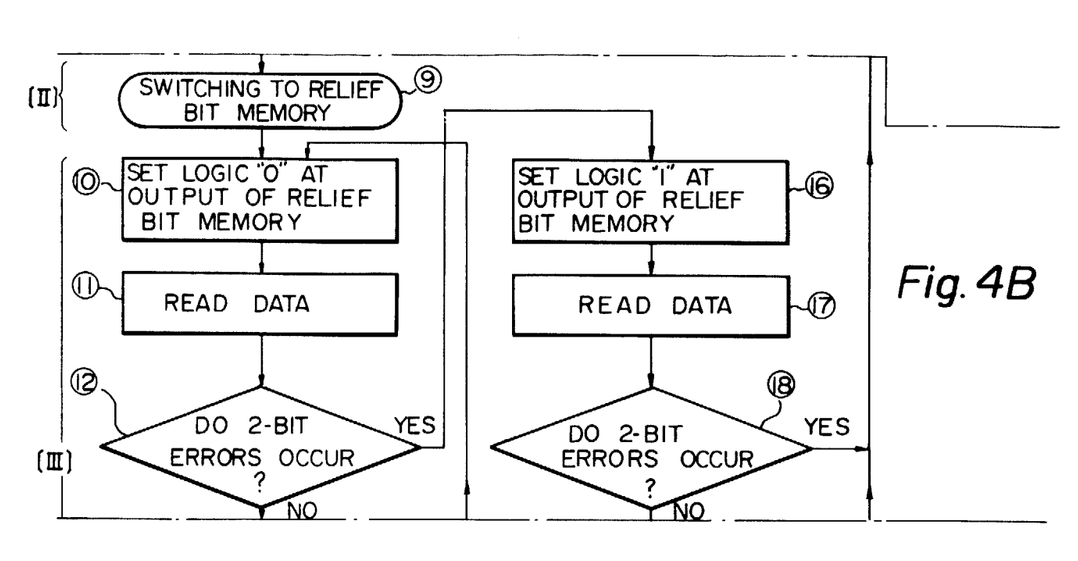
Figure 4C:
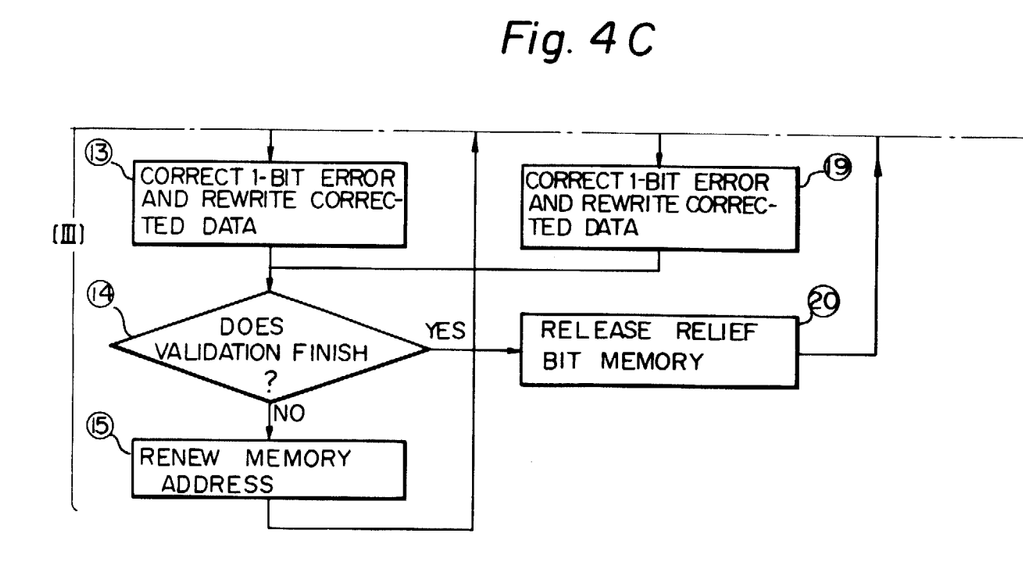

The operation of the error-correcting system 12 will be more apparent from the flow chart depicted in FIGS. 4A, 4B and 4C. When one or more bit errors occur in the main memory 11 (FIG. 1), the ECC logic circuit 122 (FIGS. 1 and 3) detects the bit errors (see a step ① representing "MEMORY ERROR DETECTION"). Then, the ECC logic circuit 122 discriminates whether or not the error is a 1-bit error (see a step ② representing "IS IT 1-BIT ERROR?"). If the result of the step ② is "NO", since the error is a 2-bit error. Since the ECC logic circuit 122 cannot correct such a 2-bit error, it produces an alarm (see a step ③ representing "GENERATE ALARM"). However, if the result of the step ② is "YES", the ECC logic circuit 122 corrects the 1-bit error and, thereafter, rewrites the corrected data into the corresponding memory cell which has produced the bit error (see step ④ representing "CORRECT 1-BIT ERROR AND REWRITE CORRECTED DATA"). Then, the ECC logic circuit 122 again reads the data from the main memory 11 including the data of said memory cell, at the corresponding address (see a step ⑤ representing "READ DATA AGAIN"). Therefore, the ECC logic circuit detects the occurrence of errors in the data which has been rewritten (see step ⑥ representing "IS IT 1-BIT ERROR?"). It should be remembered that, since the soft error does not occur repeatedly in the same memory cell, if said 1-bit error has been induced by a soft error, such 1-bit soft error may be erased by the rewriting operation performed in the step ④. In other words, if said 1-bit error has been induced not by a soft error, but a hard error, such 1-bit error is still maintained regardless of the rewriting operation of the step ④. That is, if the result of the step ⑥ is "YES", it is concluded that the 1-bit error has been induced by a hard error. On the other hand, if the result of the step ⑥ is "NO", it is concluded that the error may be either 2 or more bit errors or a no error. A discrimination of this is achieved in step ⑦ representing "ARE THEY 2 OR MORE BIT ERRORS?". If the result of this step ⑦ is "NO", it is determined that the no error is a result of a correction of a soft error. This soft error is indicated, in step ⑧, that the error has been corrected. Thus, a process I, defined by the steps ② through ⑦, can be called a process for discriminating whether the error is induced by a hard error or a soft error.

When the result of the step ⑥ is "YES", the previously mentioned switching operation, from the main memory 11 to the relief bit memory 121 (FIG. 1), is achieved (see step ⑨ representing "SWITCHING TO RELIEF BIT MEMORY"). Thus, in a process II, a defective memory cell, having a hard error, is relieved by the corresponding relief bit memory. Thereafter, a process III, for achieving the previously mentioned validation operation, is carried out. The process III is necessary for storing correct data in the corresponding relief bit memory. The words "correct data" mean data which would have been stored in the main memory cell if this main memory cell had no hard error.

In the process III, first, the output data from the relief bit memory 121-0 is forced to be logic "0" (see step ⑩ representing "SET LOGIC" "0" "AT OUTPUT OF RELIEF BIT MEMORY"). The logic "0" is provided from the aforesaid signal line L7-D illustrated in FIG. 3. Then, the data, at the corresponding address including the defective memory cell, is read by the ECC logic circuit (see step ⑪ representing "READ DATA"). It should be remembered that, since soft errors occur very frequently, compared to the occurrence of hard errors, a soft error may occur during the process III, that is the validation operation. Accordingly, the following step ⑫ is important. If such a soft error overlaps the 1-bit hard error, a 2-bit error will occur. If the result of the step ⑫, representing "DO 2-BIT ERRORS OCCUR?", is "NO", it is concluded that no such soft error has occurred. Then, the 1-bit hard error is corrected and the corrected data is rewritten into the corresponding relief bit memory (see step ⑬ representing "CORRECT 1-BIT ERROR AND REWRITE CORRECTED DATA").

Returning to the step ⑫, if the result of this step ⑫ is "YES", it is concluded that 2-bit errors have occurred during the validation operation. At this stage, one of the 2-bit errors may be derived from the fixed logic "1" set in the step ⑩ and the other thereof may be induced by a soft error. Then, the output data of the relief bit memory is changed from logic "0" to logic "1" (see a step ⑯). The logic "1" is provided from the aforesaid signal line L7-D illustrated in FIG. 3. Then, the data, at the corresponding address including the defective memory cell, is read by the ECC logic circuit (see step ⑰ representing "READ DATA"). In the read operation of the step ⑰, if the ECC logic circuit detects that there is no 2-bit errors (see "NO" of step ⑱ representing "DO 2-BIT ERRORS OCCUR"), it is concluded that the data to be stored in the corresponding relief bit memory is logic "1". Thus, the 2-bit errors are reduced to a 1-bit error. In this case, this 1-bit error is determined to be a soft error. Therefore, this 1-bit soft error can easily be erased by the rewrite operation of step ⑲, which is identical to that of the step ⑬. However, if the result of the step ⑱ is "YES", it is concluded that the 2-bit errors, which have been detected in the step ⑫, may be induced by 2-bit soft errors or a combination of a 1-bit soft error and a 1-bit hard error occurring in one of the main memory cells other than the main memory cell which is now relieved by the relief bit memory. In this case, it is impossible for the ECC logic circuit to correct such 2-bit errors. In the error-correcting system of the present invention, even though the ECC logic circuit itself cannot correct such 2-bit errors, the system can correct one of the 2-bit errors by selectively setting the logic "1" or "0" at the output of the relief bit memory. If the other of the 2-bit errors is a soft error, this soft error can easily be erased by said rewrite operation of the corrected data. Returning to the step ⑱, if the result of this step ⑱ is "YES", the process is directed to the step ③ and the alarm is generated.

The above mentioned sequence defined by the steps ⑩ through ⑬ or the steps ⑩ through ⑬ and ⑯ through ⑲, is achieved sequentially with respect to all the addresses, for example 64,000 times (refer to 64K WORDS in FIG. 2B) via a step ⑭, representing "DOES VALIDATION FINISH?" and a step ⑮, representing "RENEW MEMORY ADDRESS". If the result of the step ⑭ is "YES", the validation operation is completely finished and a step ⑳ starts. In the step ⑳ (representing "RELEASE RELIEF BIT MEMORY"), the fixed logic "0" (step ⑩) or the fixed logic "1" (step ⑯) is released. That is, referring to FIG. 3, the logic of the signal line L7-G0 is changed from "1" to "0". After releasing the relief bit memory, the step ③ takes place, so that a normal read and write operation will be commenced.

Figure 5:
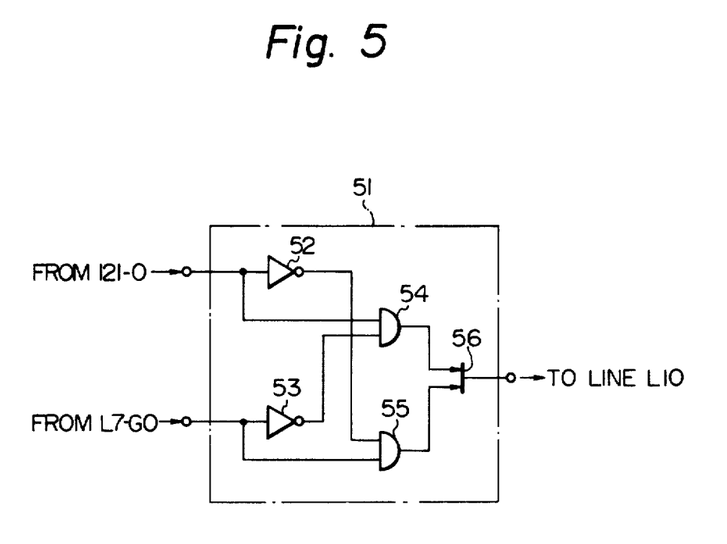
FIG. 5 is a block diagram depicting another example of the arrangement of gates 35, 36 and 37, shown in FIG. 3.

The arrangement of the gates 35, 36 and 37, illustrated in FIG. 3, can be replaced by another arrangement, as illustrated in FIG. 5. According to the arrangement of the gates 35, 36 and 37 in FIG. 3, the signal of logic "1" or "0" is supplied externally via the signal line L7-D. However, according to the arrangement of FIG. 5, such signal of logic "1" or "0" is not necessary, because the identical signal of logic "1" or "0" can be the output data of the relief bit memory 121-0 itself. That is, such signal can be produced from an EOR (Exclusive OR) gate 51, which receives both the output data from the memory 121-0 of FIG. 3 and a gate control signal from the signal line L7-G0 of FIG. 3. The output of the gate 51 is applied to the signal line L10 of FIG. 3. The EOR gate 51 can be made of inverters 52 and 53, AND gates 54 and 55 and OR gate 56. If the gate control signal is logic "0", the output data itself of the relief bit memory 121-0 is produced from the OR gate 56 via the AND gate 54. In this case, if the ECC logic circuit 122 (FIGS. 1 and 3) still detects 2-bit errors, then the gate control signal is changed from logic "0" to "1". Then the inverted output data from the relief bit memory 121-0 is produced from OR gate 56 via inverter 52 and AND gate 55.

As explained in detail with reference to the accompanying drawings, although the n-bits hard and soft error-correcting and n+1-bits hard and soft error-detecting (ECC) logic circuit is employed, a n+1-bits hard and soft error-correcting system can be realized.

We claim:

1. An error-correcting system, operatively connected between a main memory and a central processing unit, comprising:

an error correction code logic circuit, which can correct n-bit errors, where n is a positive integer, and detect n+1-bit errors;

first means, operatively connected to said central processing unit and said error correction code logic circuit, for discriminating whether an error, occurring in said main memory, is a soft error or a hard error;

second means for storing data for a defective memory cell of said main memory, which defective memory cell produces the hard error;

third means, operatively connected to said main memory, said first means and said second means, for, when a hard error is found by using said first means, switching the data for the defective memory cell of said main memory to said second means; and fourth means, operatively connected to said first means and said third means, for effecting a validation operation with respect to the data to be stored in said second means.

2. An error-correcting system as set forth in claim 1, wherein said error-correcting system further comprises fifth means, operatively connected to said fourth means and said error correction code logic circuit, for, when n+1-bit errors are found during said validation operation, reducing the n+1-bit errors to n-bit errors through said error correction code logic circuit.

3. An error-correcting system as set forth in claim 1, wherein said first means comprises:

means for producing corrected data for a soft or hard error by means of said error correction code logic circuit;

means for writing the corrected data into the memory cell in which a soft or hard error occurs; and means for reading the written corrected data from the memory cell, and if the error correction code logic circuit determines that the corrected data still includes an error, said first means discriminates the occurrence of the hard error and if the error correction code logic circuit determines that the corrected data includes no error, the first means discriminates the occurrence of the soft error.

4. An error-correcting system as set forth in claim 1, wherein said second means comprises of one or more relief bit memories which can relieve the defective memory cells of said main memory.

5. An error-correcting system as set forth in claim 4, wherein said main memory comprises k words, where k is an integer, and wherein the k words comprising said main memory are divided into a plurality of groups, and each of said relief bit memories are allotted to one of these groups, respectively, each of the relief bit memories comprising 1 bit in width and k bits in length.

6. An error-correcting system as set forth in claim 1, wherein said error correction code logic circuit produces write data and an error-position indicating signal, wherein said main memory produces read data, and wherein said third means comprises a switching circuit comprising first and second switching gates each having first and second inputs, said second switching gates further having third inputs, both said first and second switching gates arranged in a bit-to-bit fashion, each of the first switching gates receives, at its first input, the write data from the error correction code logic circuit, and at its second input, the error-position indicating signal produced by the error correction code logic circuit, and one of the first switching gates, specified by the error-position indicating signal, transfers the write data to said second means, and each of said second switching gates receives, at its first input, the read data from the main memory, at its second input, the data stored in said second means, and at its third input, said error-position indicating signal, and one of the second switching gates, specified by the error-position indicating signal transfers the read data to the error correction code logic circuit.

7. An error-correcting system as set forth in claim 1, wherein said fourth means comprises a correction controlling circuit cooperating with said error correction code logic circuit and controling said third means, said fourth means functioning to store corrected data, corresponding to the hard error, in said second means.

8. An error-correcting system as set forth in claim 2, wherein said fifth means produces a first logic and a second logic sequentially at the output of said second means, until the n+1-bit errors are reduced to n-bit errors through said error correction code logic circuit.

9. An error-correcting system as set forth in claim 8, wherein said first and second logics are externally supplied to the output of said second means.

10. An error-correcting system as set forth in claim 8, wherein said fifth means comprises an exclusive OR gate, and
wherein said first and second logics are produced by the output data from said second means or by the inverted output data from said second means, by means of said exclusive OR gate.

11. An error-correcting system, operatively connected between a main memory and a central processor, comprising:
a relief memory;
a switching circuit, operatively connected to said main memory and said relief memory, for switching between said main memory and said relief memory and for passing data therethrough;
an error correction code logic circuit, operatively connected to said central processor and said switching circuit, for detecting hard and soft errors, for generating an error detection signal and an error position signal in dependence upon the data output by said switching circuit and for outputting corrected data; and
a correction controlling circuit, operatively connected to said switching circuit and said error correction code logic circuit, for generating a relief switching signal and a control signal in dependence upon the error detection signal and the error position signal;
said switching circuit switching to said relief memory, when the hard error is detected and storing the corrected data in said relief memory when the hard error is detected and storing the corrected data in the main memory when the soft area is detected, in dependence upon the relief switching signal and the control signal.

* * * * *

UNITED STATES PATENT AND TRADEMARK OFFICE
CERTIFICATE OF CORRECTION

PATENT NO. : 4,394,763

DATED : July 19, 1983

INVENTOR(S) : Genzo Nagano et al

It is certified that error appears in the above-identified patent and that said Letters Patent is hereby corrected as shown below:

Front page, [73] Assignee, "Tokyo" should be --Kawasaki--;

[57] ABSTRACT, line 13, "The data" should be --Data--.

Column 2, line 19, "Firstly" should be --First--;
line 34, "errors," should be --errors--;
line 35, after "word", insert --,--;
line 59, after "error", insert --both in different words--.

Column 3, line 12, "error," should be --error--;
line 13, after "words", insert --,--;
line 16, "mode," should be --mode--.

Column 5, line 7, after "rises", insert --,--;
line 15, delete "of";
delete "main";
line 16, after "the", second occurrence, insert --main--;
line, 20 "71th" should be --71st--;
line 46, "151-S" should be --121-5--.

UNITED STATES PATENT AND TRADEMARK OFFICE
CERTIFICATE OF CORRECTION

PATENT NO. : 4,394,763

DATED : July 19, 1983

INVENTOR(S) : Genzo Nagano et al

It is certified that error appears in the above-identified patent and that said Letters Patent is hereby corrected as shown below:

```
Column 6, line 1,    "product" should be --produced--;
          line 4,    "mmeory" should be --memory--;
          line 5,    delete "circuit";
          line 15,   "possess" should be --passes--;
          line 22,   after "from", insert --the--;
          line 40,   ", 121-0" should be --121.0,--.

Column 10, line 45,  delete "of".

Column 11, line 16,  "controling" should be --controlling--.
```

Signed and Sealed this

Twentieth Day of March 1984

[SEAL]

Attest:

*Attesting Officer*

GERALD J. MOSSINGHOFF

*Commissioner of Patents and Trademarks*